(12) United States Patent
Noh et al.

(10) Patent No.: US 10,797,464 B2
(45) Date of Patent: Oct. 6, 2020

(54) WAVELENGTH LOCKING STRUCTURE AND METHOD FOR TUNABLE LASER

(71) Applicant: CHEM OPTICS INC., Daejeon (KR)

(72) Inventors: Young Ouk Noh, Sejong (KR); Woo jin Lee, Yongin-si (KR); Yoon Koo Kwon, Cheongju-si (KR); Jun Kyu Seo, Daejeon (KR)

(73) Assignee: CHEM OPTICS INC., Daejeon (KR)

( * ) Notice: Subject to any disclaimer, the term of this patent is extended or adjusted under 35 U.S.C. 154(b) by 374 days.

(21) Appl. No.: 15/575,913

(22) PCT Filed: Nov. 23, 2016

(86) PCT No.: PCT/KR2016/013519
§ 371 (c)(1),
(2) Date: Nov. 21, 2017

(87) PCT Pub. No.: WO2018/079914
PCT Pub. Date: May 3, 2018

(65) Prior Publication Data
US 2018/0358774 A1    Dec. 13, 2018

(30) Foreign Application Priority Data

Oct. 31, 2016  (KR) .................. 10-2016-0142895

(51) Int. Cl.
*H01S 3/13*        (2006.01)
*G02B 27/10*     (2006.01)
(Continued)

(52) U.S. Cl.
CPC ........ *H01S 3/1305* (2013.01); *G02B 27/1006* (2013.01); *G02B 27/108* (2013.01);
(Continued)

(58) Field of Classification Search
CPC .... H01S 3/1305; H01S 5/0687; H01S 5/0683; H01S 5/141; H01S 3/0405;
(Continued)

(56) References Cited

U.S. PATENT DOCUMENTS

| 5,198,872 A | 3/1993 | Wakabayashi et al. |
| 5,659,560 A * | 8/1997 | Ouchi .................... B82Y 20/00 |
| | | 372/27 |

(Continued)

FOREIGN PATENT DOCUMENTS

| JP | 2004047729 A | 2/2004 |
| JP | 2004146523 A | 5/2004 |

(Continued)

OTHER PUBLICATIONS

International Search Report of PCT/KR2016/013519, dated May 29, 2017.

(Continued)

*Primary Examiner* — Yuanda Zhang
(74) *Attorney, Agent, or Firm* — STIP Law Group, LLC

(57) ABSTRACT

The present invention relates to a wavelength locking structure for a tunable laser and a wavelength locking method for a tunable laser. According to the present invention, since it is possible to use only one element for measuring the intensity of light, the number of parts is reduced in comparison to methods of the related art, so it is possible to perform wavelength locking economically with a downsized structure.

7 Claims, 9 Drawing Sheets

(51) Int. Cl.
  *H01S 3/0941* (2006.01)
  *H01S 3/08* (2006.01)
  *H01S 3/04* (2006.01)
  *H01S 5/14* (2006.01)
  *H01S 5/0683* (2006.01)
  *H01S 5/0687* (2006.01)
  *G02B 5/28* (2006.01)
  *H01S 5/022* (2006.01)
  *H01S 3/139* (2006.01)
  *H01S 5/06* (2006.01)

(52) U.S. Cl.
  CPC ........ *H01S 3/0405* (2013.01); *H01S 3/08009* (2013.01); *H01S 3/09415* (2013.01); *H01S 5/0683* (2013.01); *H01S 5/0687* (2013.01); *H01S 5/141* (2013.01); *G02B 5/28* (2013.01); *H01S 3/1398* (2013.01); *H01S 5/02252* (2013.01); *H01S 5/0612* (2013.01)

(58) Field of Classification Search
  CPC ............ H01S 3/08009; H01S 3/09415; H01S 5/0612; H01S 3/1398; H01S 5/02252; H01S 3/1109; H01S 3/08036; G02B 27/108; G02B 27/1006; G02B 5/28; G02B 27/149
  See application file for complete search history.

(56) References Cited

U.S. PATENT DOCUMENTS

| | | | |
|---|---|---|---|
| 6,370,170 B1 | 4/2002 | Glance | |
| 6,546,028 B1* | 4/2003 | Tayebati | H01S 5/0687 372/20 |
| 6,782,017 B1* | 8/2004 | Kai | H01S 5/0687 359/247 |
| 7,899,105 B1* | 3/2011 | Hargis | H01S 5/146 372/102 |
| 2003/0035119 A1 | 2/2003 | Myatt | |
| 2003/0076564 A1* | 4/2003 | Furuichi | H01S 5/02252 398/129 |
| 2003/0112837 A1* | 6/2003 | Vakhshoori | G01J 3/26 372/20 |
| 2011/0052207 A1* | 3/2011 | Ishikawa | H01S 5/0687 398/182 |
| 2013/0182729 A1* | 7/2013 | Li | H01S 5/0687 372/20 |
| 2013/0343411 A1* | 12/2013 | Banno | H01S 5/06 372/20 |
| 2014/0036940 A1* | 2/2014 | Tanaka | H01S 5/0617 372/20 |

FOREIGN PATENT DOCUMENTS

| | | |
|---|---|---|
| JP | 2005340359 A | 12/2005 |
| JP | 2011054714 A | 3/2011 |
| JP | 2015076467 A | 4/2015 |

OTHER PUBLICATIONS

The extended European search report of 16901903, dated Jul. 9, 2019.

Korean Office Action from Korean Intellectual Property Office, dated Nov. 16, 2017.

* cited by examiner

WAVELENGTH LOCKING STRUCTURE AND METHOD FOR TUNABLE LASER

VROSS-REFERENCE TO RELATED APPLICATIONS

This application is the U.S. National Phase under 35 U.S.C. § 371 of International Application No. PCT/KR2016/013519 filed Nov. 23, 2016, which in turns claims the benefit of Korean Application No. 10-2016-0142895, filed on Oct. 31, 2016, the disclosures of which are incorporated by reference into the present application.

TECHNICAL FIELD

The present invention relates to a wavelength locking structure and method for a tunable laser and, more particularly, to a wavelength locking structure for a tunable laser which is small and economical in comparison to the related art, and a wavelength locking method for a tunable laser.

BACKGROUND ART

Most tunable lasers are equipped with a built-in integrated wavelength locking module. Wavelength locking, which means outputting a laser beam with a wavelength at a predetermined fixed level, is increasingly important to preclude interference and noise between adjacent wavelengths.

In order to lock wavelengths using wavelength locking modules, a method that uses reference absorption gas, a method that uses fiber grating, a method that uses an etalon filter etc. have been used. A WDM (Wavelength Division Multiplexing) optical network type that has been recently used, multiplexes a wavelength for each subscriber and service and receives several optical links through one optical fiber, and requires wavelength locking with channel spaces of 50 GHz, 100 GHz, or 200 GHz in a wide wavelength tunable range, so the method for using an etalon filter is generally used.

FIG. 1 schematically shows a wavelength locking structure using an etalon filter in the related art and the wavelength locking structure in the related art is described first with reference to FIG. 1. As shown in FIG. 1, light emitted from a tunable laser 10 of FIG. 1 is converted into parallel light through a collimator 20 and the parallel light travels into a first light separator 30 and is then separated into transmitted light 1 and reflected light 2. The transmitted light 1 is used such as for communication and the reflected light 2 is light for a wavelength locking structure. The reflected light 2 travels into a second light separator 40 and is then separated into first light 3 transmitting with intensity of 30% of the reflected light 2 and second light 4 reflected with intensity of 70% of the reflected light 2. The first light 3 travels into a first light receiver 50 and the second light 4 travels into a second light receiver 70 through an etalon filter 60. The first and second light receivers are optical elements for measuring the intensity of incident light and wavelength locking is performed using the intensities of light that are measured by the first and second light receivers.

This is described in more detail hereafter. The etalon filter 60 transmits only wavelength in a predetermined bandwidth of incident light and FIG. 2 shows a quantity of light according to the wavelength of the second light 4 that transmits the etalon filter 60. Referring to FIG. 2, it can be seen that as the wave length linearly changes, the quantity of light of the second light 4 measured by the second light receiver 70 changes in a repeated sine wave shape.

As described above, when the wavelength of the light emitted from the tunable laser 10 changes, the light quality of the second light 4 changes, and like the position of a specific wavelength $\lambda$ in FIG. 2, it is easy to measure a quantity of light at position where a quantity of light rapidly changes in accordance with a change in wavelength. Accordingly, a method for changing the wavelength of light emitted from the tunable laser 10 using the light quantities measured by the first and second light receivers as feedback signals was used.

This method requires at least two or more light receivers, so relatively many parts are used, the size is increased, and the price is increased by the increasing parts. Accordingly, there was a need for solving this problem.

As a patent related to wavelength locking, there is Korean Patent Laid-Open Publication No. 2004-0000188 (Entitled: "Multi-channel wavelength locker and method thereof, published on Jan. 3, 2004).

DISCLOSURE

Technical Problem

An object of the present invention is to provide a wavelength locking structure and method for a tunable laser according to the present invention is to provide a wavelength locking structure for a tunable laser which is small and economical in comparison to the related art, and a wavelength locking method for a tunable laser.

Technical Solution

In one general aspect, a wavelength locking structure for a tunable laser according to the present invention for solving the problems includes: a tunable laser 100; a light separator 200 into which light emitted from the tunable laser 100 travels and that separates the light into transmitted light A and reflected light B; an etalon filter 300 that transmits the reflected light B in a predetermined wavelength band; a light receiver 400 that converts light that transmits the etalon filter 300 into an electrical signal; and a controller 500 that periodically changes the wavelength of light emitted from the tunable laser 100 using the electrical signal converted by the light receiver 400 so that a wavelength at which the quantity of light of the light that transmits the etalon filter 300 is maximum, is included.

The controller 500 may change the wavelength of the light that is periodically changed, within a predetermined range including the wavelength where the quantity of light of the light that transmits the etalon filter 300 is maximum.

The controller 500 may change the wavelength of light such that the wavelength where the quantity of light that transmits the etalon filter 300 is maximum is positioned at the center of the predetermined range.

The controller 500 may extract a DC component of the electrical signal converted by the light receiver 400 when the tunable laser 100 periodically changes the wavelength of light.

The structure may further include a collimator 610 positioned between the tunable laser 100 and the light separator 200.

The structure may further include a collimator 620 positioned between the light separator 200 and the etalon filter 300.

In another general aspect, a wavelength locking method for a tunable laser according to the present invention includes: a first step of emitting light from a tunable laser 100; a second step in which the light emitted in the first step travels into a light separator 200 and separated into transmitted light A and reflected light B; a third step in which the reflected light B travels into a light receiver 400 through an etalon filter 300; a fourth step of changing a wavelength within a predetermined range on the basis of the wavelength of the light emitted from the tunable laser 100; and a fifth step of changing the wavelength of the tunable laser 100 such that an output value of the light receiver 400 according to the wavelength changed in the fourth step is maximum.

The method may further include a sixth step in which a DC component of an electrical signal converted by the light receiver 400 is extracted when a wavelength is changed in the fourth step, and the DC component is compared with a reference value.

The first step to the fifth step may be repeated.

Advantageous Effects

According to the wavelength locking structure for a tunable laser of the present invention and a wavelength locking method using the structure, since it is possible to use only one element for measuring the intensity of light, the number of parts is reduced in comparison to methods of the related art, so it is possible to perform wavelength locking economically with a down-sized structure.

Further, according to the present invention, there is no need for a collimator for converting incident light into parallel light, the number of parts is reduced in comparison to methods of the related art, so it is possible to perform wavelength locking economically with a down-sized structure.

BEST MODE

Embodiments of a wavelength locking structure for a tunable laser according to the present invention will be described hereafter in detail with reference to the accompanying drawings.

[First Embodiment: Without Collimator]

Figure 3:
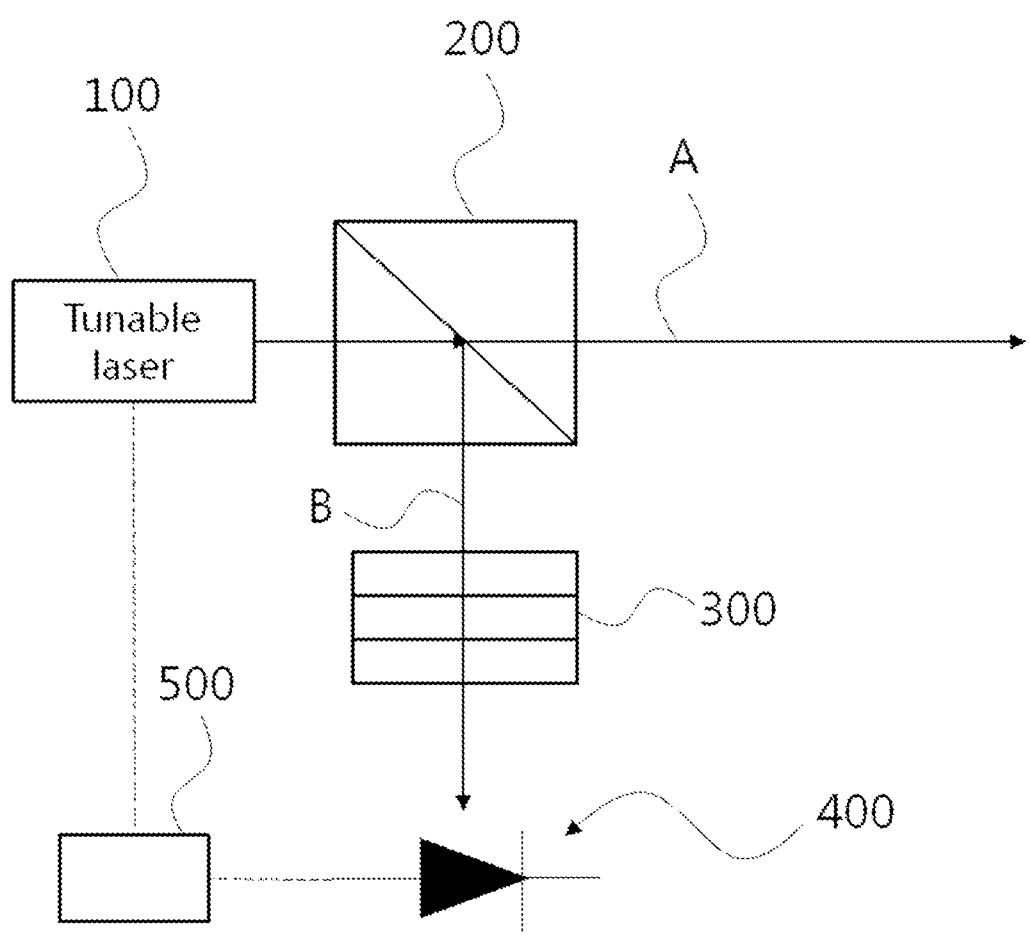
FIG. 3 is a diagram showing a first embodiment of the present invention.

FIG. 3 schematically shows a wavelength locking structure for a tunable laser according to the present invention. As shown in FIG. 3, a wavelength locking structure for a tunable laser according to the present invention includes a tunable laser 100, a light separator 200, an etalon filter 300, and a light receiver 400.

The tunable laser 100 shown in FIG. 3 is a device that has the same configuration as that described in the background of the art and emits a laser beam having a tunable wavelength in a wide wavelength range. That is, the tunable laser 100 functions as a light source in the present invention.

Figure 4:
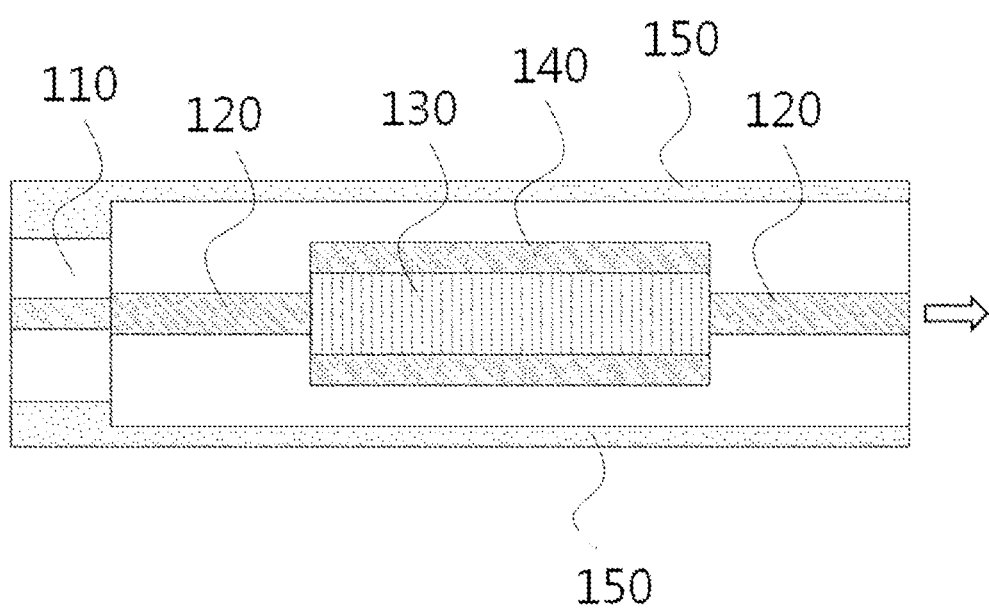
FIG. 4 is a diagram showing in detail a tunable laser of the present invention.

FIG. 4 shows the detailed structure of the tunable laser 100. As shown in FIG. 4, the tunable laser 100 may include a diode chip 110, a wavelength guide 120, a Bragg grating 130, a heater 140, and a thermoelectric element 150.

The operation of the tunable laser 100 is roughly described. A laser beam generated by the diode chip 110 that functions as a gain chip generating a gain of a laser source travels into the Bragg grating 130 through the wavelength guide 120. The Bragg grating 130, depending on the gap of the grating, transmits and emits a laser beam having a specific wavelength to a side, that is, to the right in FIG. 3.

The gap of the grating can be adjusted by adjusting the temperature using the heater 140. The heater 140 generates heat in proportion to a current that is supplied, so it is possible to adjust the wavelength of the laser beam emitted from the tunable laser 100 by adjusting the current that is supplied to the heater 140.

As another method for adjusting the gap of the grating, the thermoelectric element 150 may be used. The thermoelectric element 150 is an element that can generate and absorb heat, depending on the polarity of a current that is supplied. Using this method, it is possible to adjust the wavelength emitted from the tunable laser 100. As a method for adjusting a wavelength from the tunable laser, any one of methods using a heater, or a thermoelectric element, or both of a heater and a thermoelectric element may be used.

The light separator 200 is often called a beam splitter and is used to separate incident light into two beams at a predetermined ratio, in which the predetermined ratio is the ratio of light quantities of the two separated beams. As shown in FIG. 3, light emitted from the tunable laser 100 travels into the light separator 200 and the light separator 200 separates the light into transmitted light A and reflected light B. The transmitted light A is light that is used for common communication or other purposes and the reflected light B is used to fix the wavelength of a laser beam emitted from the tunable laser 100, which is an object of the present invention.

The reflected light B is relatively less than the transmitted light A, and in general, the transmitted light A is 90% and the reflected light B is 10% under the assumption that the quantity of light of a laser beam emitted from the tunable laser 100 is 100%.

As shown in FIG. 3, in a first embodiment of the present invention, a collimator is not installed between the tunable laser 100 and the light separator 200, which will be described below.

Figure 2:
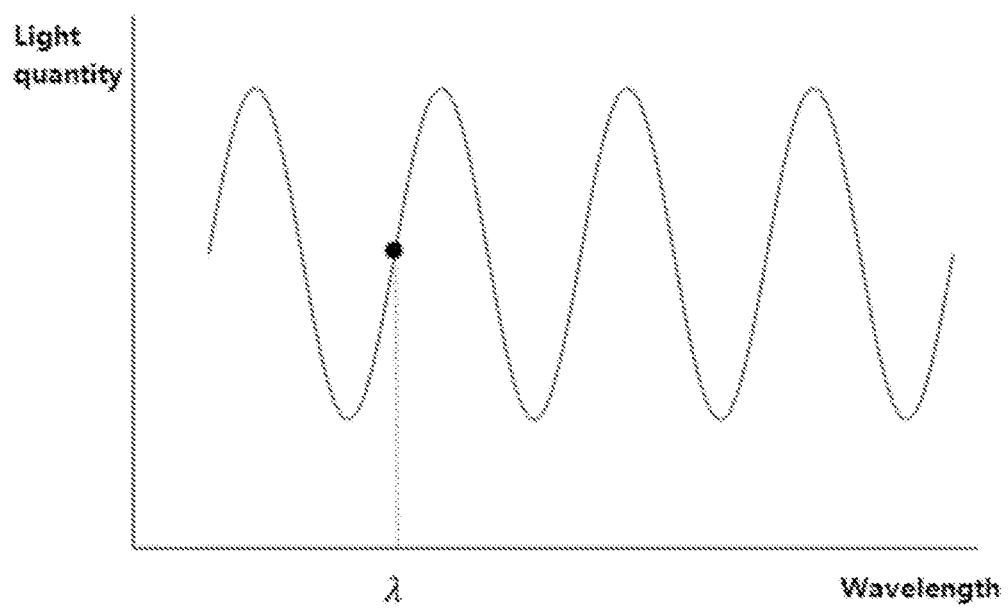
FIG. 2 is a graph showing characteristics of quantities of light at each wavelength that transmits an etalon filter.

The etalon filter 300 transmits the reflected light B in a predetermined wavelength band. As described in the background art, the transmissive characteristic of the etalon filter 300 according to a change in wavelength is as shown in FIG. 2.

The light receiver 400 converts the light that transmits the etalon filter 300 into an electrical signal. The intensity of the electrical signal converted by the light receiver 400 is in proportion to the quantity of light that transmits the etalon filter 300.

The controller 500 periodically changes the wavelength of light emitted from the tunable laser 100 using the electrical signal converted by the light receiver 400 such that a wavelength, where the quantity of light that transmits the etalon filter 300 is maximum, is included. Before this is described, some cases when errors occur in light that is emitted from a tunable laser are described first.

First, the wavelength of light emitted from a tunable laser may be changed by interference of external factors or other light (hereafter, referred to as a first problem) and, the wavelength of light emitted from a tunable laser is not changed, but the quantity of light of the light may be changed (hereafter, referred to as a second problem).

As for the first problem, it is possible to solve this problem by adjusting the wavelength of light emitted from the tunable laser 100, using the quantity of light, which travels into the light receiver 400 and is converted into an electrical signal, as a feedback signal through the controller 500. In more detail, the controller 500 changes a wavelength within a predetermined range on the basis of the wavelength (hereafter, referred to as a reference wavelength) of light initially emitted from the tunable laser 100. The predetermined range may be obtained by adding/subtracting a set wavelength to/from the reference wavelength and the reference wavelength is positioned at the exact middle of the predetermined range. This process of changing a wavelength is called swing, and changing the wavelength of light emitted from the tunable laser 100 is performed by finely changing a current that is supplied to the heater 140.

When the wavelength of light emitted from the tunable laser 100 is changed through the swing, the wavelength of the reflected light B transmitting the etalon filter 300 would be also changed. The etalon filter 300 has a characteristic that as a wavelength is linearly changed, a quantity of light has a characteristic that a sine wave is repeatedly transmitted as shown in FIG. 2. Accordingly, values of quantities of light at each wavelength transmitting the etalon filter 300 during the swing would be a portion of the repeated sine wave and the output values converted by the light receiver 400 would be also the same shape.

Figure 5:
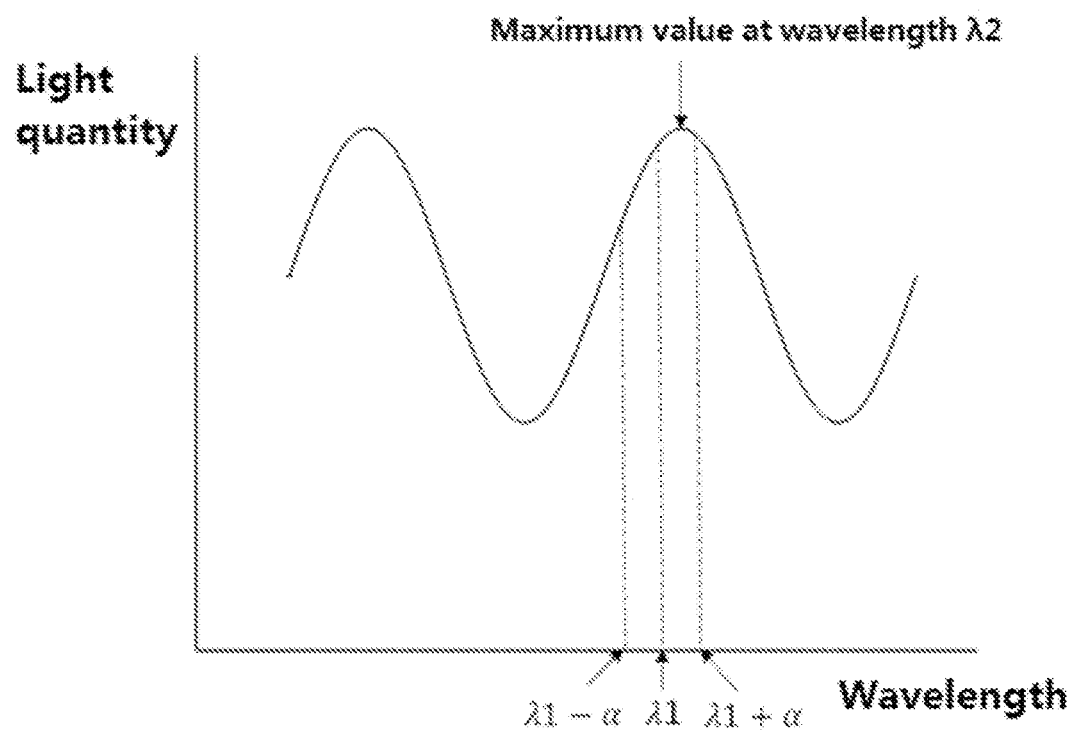
FIGS. 5 and 6 are schematic diagrams illustrating a wavelength tuning process of the present invention.

FIG. 5 is a view for briefly illustrating this, which shows output values when the wavelength of light is linearly changed and is converted by the light receiver 400 after transmitting the etalon filter 300, in which Y-axis in FIG. 5 would be originally an electrical signal, but it is proportionate to the quantity of light traveling into the light receiver 400, so the electrical signal is replaced by a quantity of light. First, the controller 500 changes a wavelength within a range obtained by adding/subtracting a predetermined range $\alpha$ to/from a reference wavelength $\lambda 1$, which is the wavelength of light initially emitted from the tunable laser 100, and obtains a quantity of light that is an output value within the range. Within the range of the minimum wavelength $\lambda 1-\alpha$ and the maximum wavelength $\lambda 1+\alpha$ shown in FIG. 5, the wavelength $\lambda 2$ where the quantity of light is maximum is positioned between the reference wavelength $\lambda 1$ and the maximum wavelength $\lambda 1+\alpha$. The controller 500 changes the wavelength of the emitted light to the wavelength $\alpha 2$ by adjusting the current supplied to the heater 140 of the tunable laser 100. Thereafter, when this process is repeated with the wavelength $\lambda s$ as a reference wavelength, the wavelength emitted from the tunable laser 100 can be fixed to a wavelength where the quantity of light is maximum.

In the embodiment shown in FIG. 5, the reference wavelength is positioned at the center in the range between the minimum wavelength and the maximum wavelength, but the present invention is not limited thereto and the reference wavelength may be positioned not at the center, but closer to one side.

The first problem can be solved through this process and a method for solving the second problem is described hereafter. The second problem occurs, as described above, when the intensity of light emitted from the tunable laser 100 should be maintained at the same level, but it is not. Controlling the intensity of light at the same level is called Automatic Power Control (hereafter, referred to as APC), and common tunable laser modules perform APC using a monitoring light receiver, but there is only one light receiver and it is used for wavelength locking in the present invention, so there is a need for a specific method.

Figure 6:
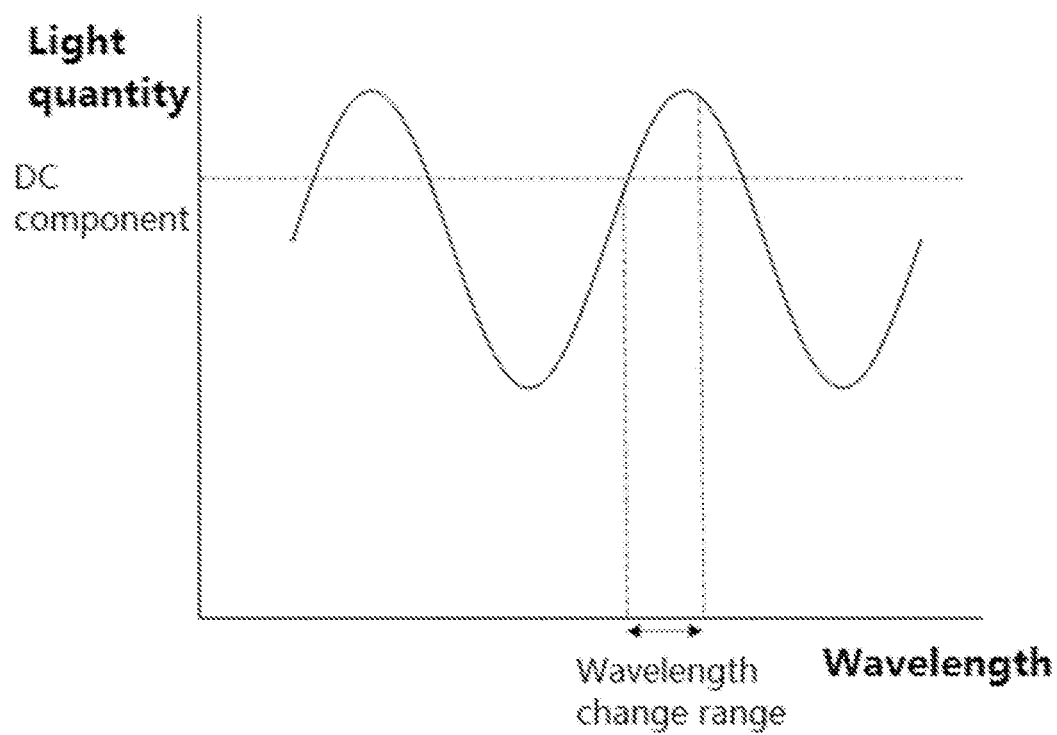

In order to solve this matter, when the tunable laser 100 periodically changes the wavelength of light, the controller 500 extracts a DC component from an electrical signal converted by the light receiver 400 and compares the DC component with a reference value. FIG. 6 schematically shows this process. When an electrical signal converted by the light receiver 400 through swing is changed by the controller 500, the electrical signal is shown as an alternating current (hereafter, referred to as AC) component. When the AC component is converted into a direct current (hereafter, referred to as DC) component, the approximate intensity of the electrical signal can be found and the quantity of light emitted from the tunable laser 100 can be found based on the intensity. If the quantity of light emitted from the tunable laser 100 is larger than a reference value, the DC value extracted from the output value of the light receiver 400 would be larger than the reference value and a user can adjust the quantity of light by operating the tunable laser 100 on the basis of the fact.

[Second Embodiment and Third Embodiment: With Collimator]

Second and third embodiments of a wavelength locking structure for a tunable laser according to the present invention will be described hereafter in detail with reference to the accompanying drawings.

Figure 7:
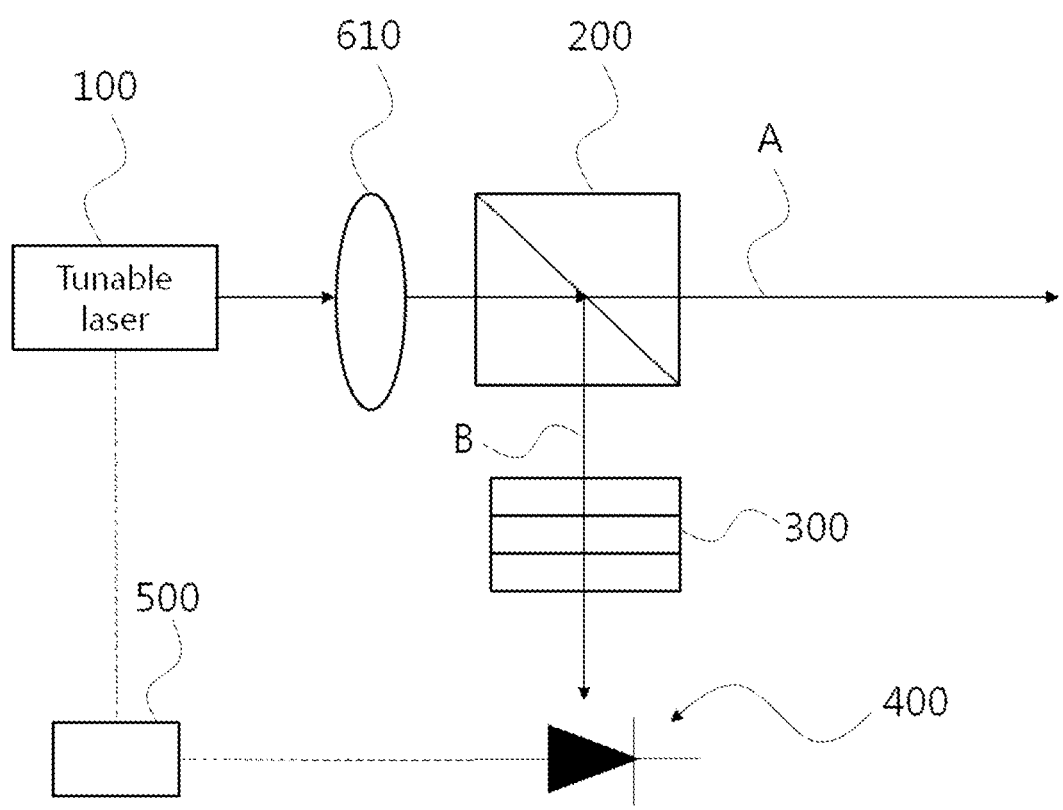
FIG. 7 is a diagram showing a second embodiment of the present invention.
Figure 8:
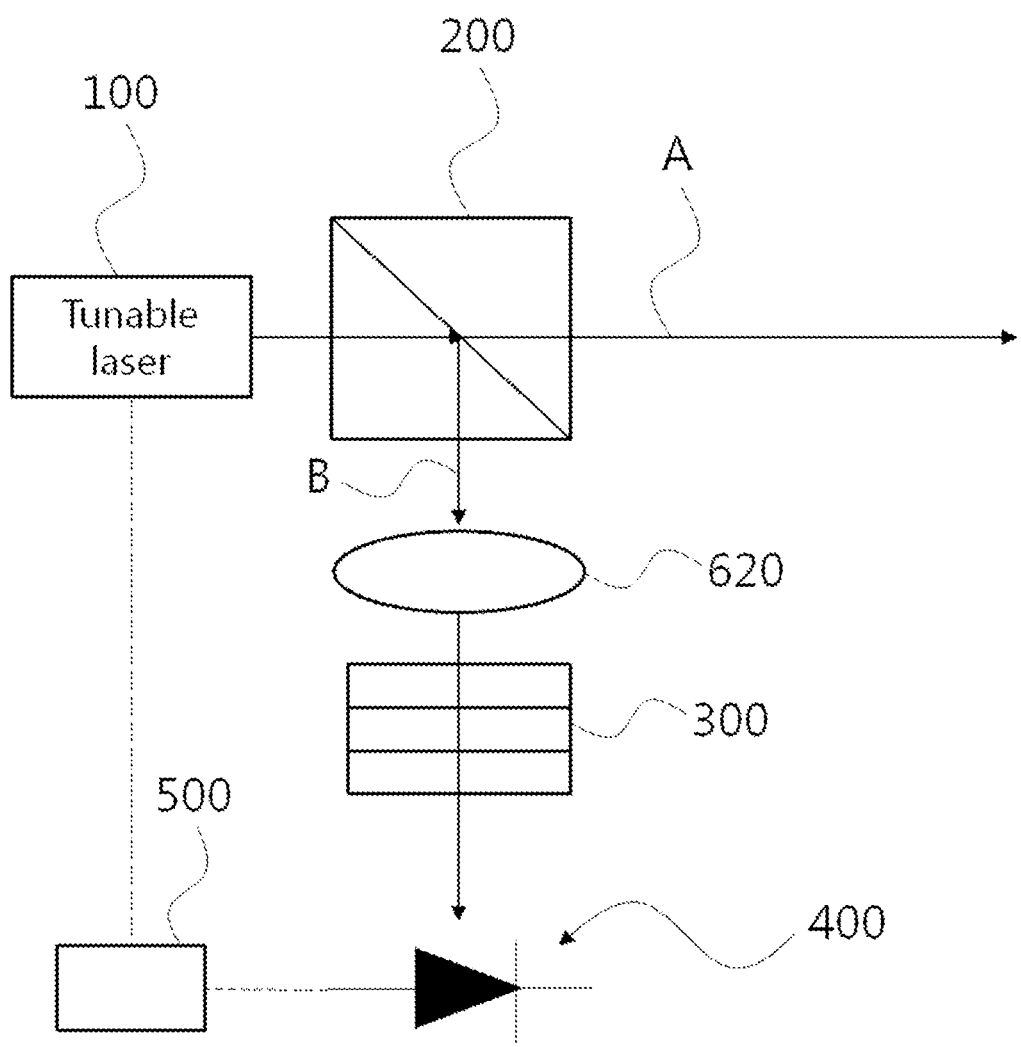
FIG. 8 is a diagram showing a third embodiment of the present invention.

FIGS. 7 and 8 are diagrams respectively showing a second embodiment and a third embodiment of a wavelength locking structure for a tunable laser according to the present invention. As shown in FIGS. 7 and 8, the second embodiment and the third embodiment of the present invention are achieved by adding collimators 610 and 620 to the first embodiment and the difference between the second embodiment and the third embodiment is the position of the collimators.

The collimators 610 and 620, which are one of optical elements called optical collimators, make incident light parallel. The collimators can increase the amplitude of transmitted light with a predetermined ratio, so when the collimators are used, more precise control with higher sensitivity is possible and it is possible to deal with smaller changes in wavelength or quantity of light.

Figure 1:
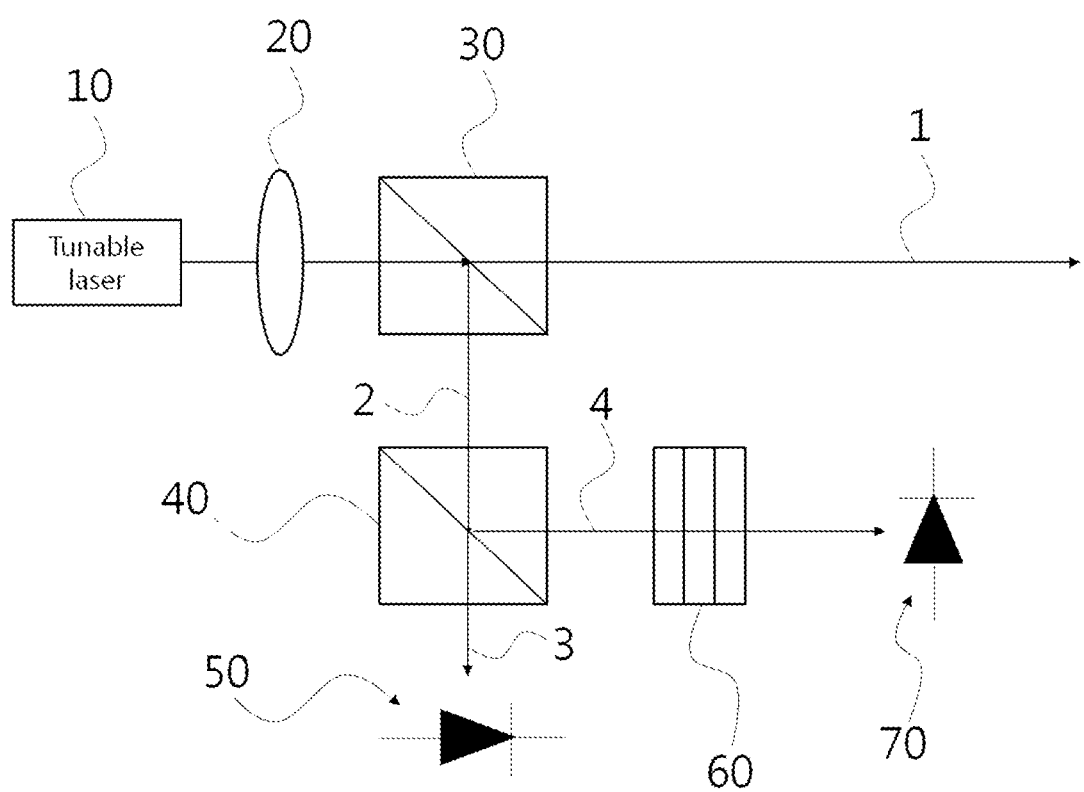
FIG. 1 is a schematic view of a wavelength locking structure in the related art.

According to the wavelength locking structure in the related art shown in FIG. 1, the collimators should be used to increase sensitivity because it is required to measure a rapid increase or decrease in quantity of light according to a change in wavelength. A collimator may be used to increase sensitivity also in the second embodiment and the third embodiment of the present invention or may not be used as in the first embodiment. As shown in FIG. 7, the collimator 610 may be positioned between the tunable laser 100 and the light separator 200, or, as shown in FIG. 8, the collimator 620 may be positioned between the light separator 200 and the etalon filter 300.

A wavelength locking method for a tunable laser according to the present invention will be described hereafter in detail with reference to the accompanying drawings. A wavelength locking method for a tunable laser according to the present invention is a method that uses the wavelength locking structure for a tunable laser described above, and in the configuration to be described hereafter, when the names and reference numbers are the same as those of the components used in the wavelength locking structure for a tunable laser, they are considered as the same components.

The wavelength locking method for a tunable laser according to the present invention includes first to six steps, which are described hereafter with reference to FIGS. 3 to 6.

The first step is a step of emitting light from the tunable laser 100 and the second step is a step in which the light emitted in the first step travels into the light separator 200 and is separated into transmitted light A and reflected light B. The transmitted light A is light that is used for common communication or other purposes and the reflected light B is light for wavelength locking. The reflected light B is divided relatively less than the transmitted light A, and in general, the transmitted light A is 90% and the reflected light B is 10% under the assumption that the quantity of light of a laser beam emitted from the tunable laser 100 is 100%.

The third step is a step in which the reflected light B travels into the light receiver 400 through the etalon filter 300. The etalon filter 300 has a characteristic that as a wavelength is linearly changed, the quantity of light is transmitted in a sine wave shape, and the transmissive characteristic of the etalon filter 300 is shown in FIG. 2.

The fourth step is a step that changes a wavelength within a predetermined range on the basis of the wavelength of light emitted from the tunable laser 100. The fourth step is performed through the controller 500, in which assuming that the wavelength of the light initially emitted from the tunable laser 100 is a reference wavelength, the range in which a wavelength is changed by the controller 500 may be obtained by adding/subtracting a set wavelength to/from the reference wavelength, which is shown in FIG. 5.

The fifth step is a step that changes the wavelength of the tunable laser 100 such that the output value of the light receiver 400 according to the wavelength changed in the fourth step is maximum value, and the fifth step is also performed through the controller 500. The fourth step and the fifth step are described with reference to FIG. 5. In the fourth step first, a wavelength is changed within a range obtained by adding/subtracting a predetermined range $\alpha$ to/from a reference wavelength $\lambda 1$, which is the wavelength of light initially emitted from the tunable laser 100, and then a quantity of light that is an output value within the range is obtained. The wavelength $\lambda 2$ where the quantity of light is maximum within the range between the minimum wavelength $\lambda 1-\alpha$ and the maximum wavelength $\lambda 1+\alpha$ is positioned between the reference wavelength $\lambda 1$ and the maximum wavelength $\lambda 1+\alpha$ in FIG. 5, so the wavelength of light emitted from the tunable laser 100 is changed to $\lambda 2$.

FIG. 5 is a diagram for illustrating this process, and in the fourth step, a wavelength is changed within a range obtained by adding/subtracting a predetermined range $\alpha$ to/from a reference wavelength $\lambda 1$, which is the wavelength of light initially emitted from the tunable laser 100, and then a quantity of light that is an output value within the range is obtained. Within the range of the minimum wavelength $\lambda 1-\alpha$ and the maximum wavelength $\lambda 1+\alpha$ shown in FIG. 5, the wavelength $\lambda 2$ where the quantity of light is maximum is positioned between the reference wavelength $\lambda 1$ and the maximum wavelength $\lambda 1+\alpha$.

In the fifth step, the controller 500 changes the wavelength of the emitted light to the wavelength $\lambda 2$ by adjusting the current supplied to the heater 140 of the tunable laser 100.

The sixth step, which is a step that determines whether the output value, that is, the quantity of light emitted from the tunable laser 100 is appropriate, extracts a DC component of an electrical signal converted by the light receiver 400 when the wavelength is changed in the fourth step, and compares the DC component with a reference value. That is, the sixth step is a step for solving the second problem described in the wavelength locking structure for a tunable laser of the present invention, in which the electrical signal converted by the light receiver 400 is changed through swing by the controller 500, the electrical signal is shown as an alternating current (hereafter, referred to as AC) component. When the AC component is converted into a direct current (hereafter, referred to as DC) component, the approximate intensity of the electrical signal can be found and the quantity of light emitted from the tunable laser 100 can be found based on the intensity. If the quantity of light emitted from the tunable laser 100 is larger than a reference value, the DC value extracted from the output value of the light receiver 400 would be larger than the reference value and a user can adjust the quantity of light by operating the tunable laser 100 on the basis of the fact.

The first to sixth steps are performed even after the wavelength locking function is performed, so even if the wavelength of light emitted from the tunable laser 100 is changed, it can be corrected, or even if the wavelength is not changed and the intensity of light, that is, a quantity of light is changed, it is possible to immediately know the fact.

A method that can find a desired channel using the above-mentioned method is described. Various channels are formed in a desired wavelength band in common optical communication. In this case, whether a specific wavelength shows a channel to be measured is determined in the stage of design and channel assignment information for each wavelength is made in data and stored in a separate memory. The method to be described below, unlike the above-mentioned method, stores the output value (quantity of light) of an initial wavelength in a memory and finds a desired channel on the basis of the output value and uses the wavelength locking structure for a tunable laser of the present invention shown in FIG. 3.

Figure 9:
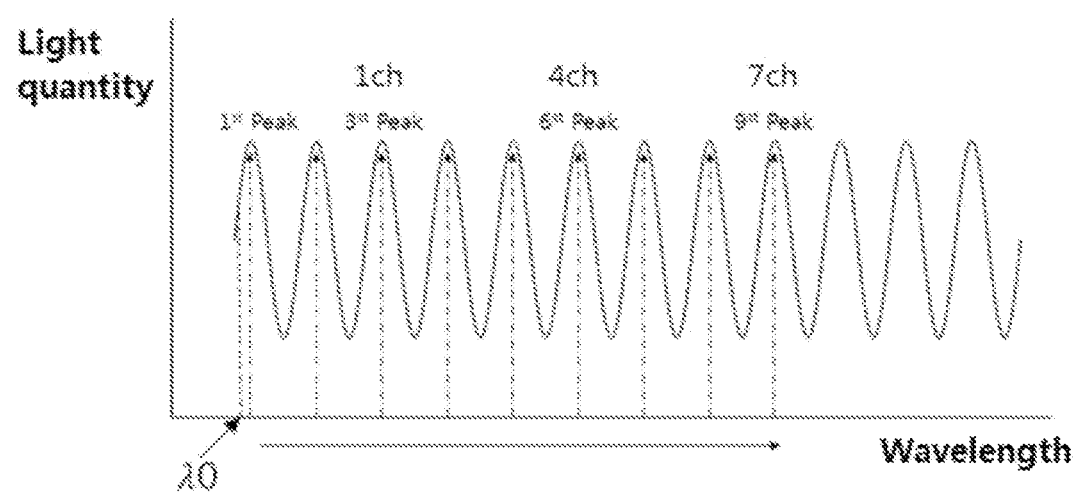
FIG. 9 is a schematic diagram illustrating a process of finding a channel of the present invention.

First, it is required to know the initial wavelength value of light emitted from the tunable laser, which is shown as an initial wavelength $\lambda 0$ in FIG. 9. As shown in FIG. 7, a bandwidth is determined for each channel. In FIG. 9, a first channel was determined when peak values were repeated three times, a fourth channel was determined when peak values were repeated six times, and a seventh channel was determined when peek values were repeated nine times.

The wavelength of emitted light is gradually increased from the initial wavelength $\lambda 0$ by adjusting the current supplied to the heater of the tunable laser. As the wavelength of the light emitted from the tunable laser is gradually increased, the quantity of light that is the output value would be changed in a sine wave shape and the maximum of the quantity of light would be repeatedly shown. In the method for the present invention, it is possible to find a specific channel by counting the number of times when the maximum of the quantity of light is shown, and according to the method, it is possible to find a desired channel even if channel information for each wavelength is not initially stored, as compared with the methods of the related art.

The present invention is not limited to the embodiments described above, may be used for various fields, and may be modified in various ways without departing from the spirit of the present invention described in claims.

[Detailed Description of Main Elements]

| | |
|---|---|
| 1, A: Transmitted light | 2, B: Reflected light |
| 3: First light | 4: Second light |
| 10, 100: Tunable laser | |
| 20: Collimator | |
| 30: First light separator | |
| 40: Second light separator | |
| 50: First light receiver | |
| 60, 300: Etalon filter | |
| 70: Second light receiver | |
| 110: Diode chip | 120: Wavelength guide |
| 130: Bragg grating | 140: Heater |
| 150: Thermoelectric element | |
| 200: Light separator | |
| 400: Light receiver | |
| 500: Controller | |

The invention claimed is:

1. A wavelength locking structure for a tunable laser, the structure comprising:

the tunable laser;

a light separator into which light emitted from the tunable laser travels and that separates the light into transmitted light A and reflected light B;

an etalon filter that transmits the reflected light B in a predetermined wavelength band;

a light receiver that converts the light that is transmitted through the etalon filter into an electrical signal; and a controller that periodically changes a wavelength of the light emitted from the tunable laser using the electrical signal converted by the light receiver so that a wavelength at which a quantity of the light that is transmitted through the etalon filter is maximum is included, wherein when the wavelength of the light emitted from the tunable laser is periodically changed, the controller extracts a DC component from the electrical signal converted as an AC component by the light receiver and compares the DC component with a reference value to adjust a quantity of the light emitted from the tunable laser, and the controller increases the wavelength of the light emitted from the tunable laser, and according to the increase in the wavelength of the light emitted from the tunable laser, the controller counts the number of times when the quantity of the light transmitted through the etalon filter is maximum to find a channel for optical communication.

2. The structure of claim 1, wherein the controller changes the wavelength of the light that is periodically changed, within a predetermined range including the wavelength where the quantity of light of the light that transmits the etalon filter is maximum.

3. The structure of claim 2, wherein the controller changes the wavelength of light so that the wavelength at which the quantity of light of the light that transmits the etalon filter is maximum is positioned at the center of the predetermined range.

4. The structure of claim 1, further comprising a collimator positioned between the tunable laser and the light separator.

5. The structure of claim 1, further comprising a collimator positioned between the light separator and the etalon filter.

6. A wavelength locking method for a tunable laser, the method comprising:

a first step of emitting light from the tunable laser;

a second step in which the light emitted in the first step travels into a light separator and is separated into transmitted light A and reflected light B;

a third step in which the reflected light B travels into a light receiver through an etalon filter;

a fourth step of changing a wavelength within a predetermined range on the basis of the wavelength of the light emitted from the tunable laser;

a fifth step of changing the wavelength of the tunable laser so that an output value of the light receiver according to the wavelength changed in the fourth step is maximum; and a sixth step of extracting a DC component from an electrical signal converted as an AC component by the light receiver when the wavelength is changed in the fourth step and comparing the DC component with a reference value to adjust a quantity of the light emitted from the tunable laser, wherein in the fifth step, the wavelength of the light emitted from the tunable laser is increased, and according to the increase in the wavelength of the light emitted from the tunable laser, the number of times when a quantity of the light transmitted through the etalon filter is maximum is counted to find a channel for optical communication.

7. The method of claim 6, wherein the first step to the fifth step are repeated.

* * * * *